US012665387B2

(12) United States Patent
Matsui et al.

(10) Patent No.: US 12,665,387 B2
(45) Date of Patent: Jun. 23, 2026

(54) BANDWITH ENHANCED DFB+R LITE LASER

(71) Applicant: II-VI Delaware, Inc., Wilmington, DE (US)

(72) Inventors: Yasuhiro Matsui, Milpitas, CA (US); Ashish Verma, San Jose, CA (US); Martin Kwakernaak, Wilmington, DE (US)

(73) Assignee: II-VI DELAWARE, INC., Wilmington, DE (US)

( * ) Notice: Subject to any disclaimer, the term of this patent is extended or adjusted under 35 U.S.C. 154(b) by 885 days.

(21) Appl. No.: 17/817,394

(22) Filed: Aug. 4, 2022

(65) Prior Publication Data

US 2024/0047939 A1 Feb. 8, 2024

(51) Int. Cl.
| | |
|---|---|
| *H01S 5/0625* | (2006.01) |
| *H01S 5/028* | (2006.01) |
| *H01S 5/042* | (2006.01) |
| *H01S 5/10* | (2021.01) |
| *H01S 5/125* | (2006.01) |
| *H01S 5/34* | (2006.01) |

(52) U.S. Cl.
CPC ............ *H01S 5/0427* (2013.01); *H01S 5/028* (2013.01); *H01S 5/06256* (2013.01); *H01S 5/06258* (2013.01); *H01S 5/1039* (2013.01); *H01S 5/125* (2013.01); *H01S 5/34* (2013.01)

(58) Field of Classification Search
None
See application file for complete search history.

(56) References Cited

U.S. PATENT DOCUMENTS

| | | | |
|---|---|---|---|
| 4,908,833 A | 3/1990 | Chraplyvy et al. | |
| 9,048,618 B2 * | 6/2015 | Matsui | H01S 5/06256 |
| 10,063,032 B2 * | 8/2018 | Matsui | H01S 5/06258 |
| 11,251,585 B2 * | 2/2022 | Matsui | H01S 5/1021 |
| 11,784,464 B2 * | 10/2023 | Matsui | H01S 5/227 |
| | | | 372/26 |
| 2005/0238079 A1 | 10/2005 | Botez | |

(Continued)

FOREIGN PATENT DOCUMENTS

EP 1154533 A1 11/2001

OTHER PUBLICATIONS

Matsui—Book, Datacenter Connectivity Technologies: Principles and Practice, ISBN 9788793609228, River Publishers Series in Optics and Photonics, Chapter 3—"Directly Modulated Laser Technology: Past, Present, Future" River Publishers Oct. 8, 2018 (86 Pgs.).

(Continued)

*Primary Examiner* — Tod T Van Roy
(74) *Attorney, Agent, or Firm* — Blank Rome LLP

(57) ABSTRACT

A distributed feedback plus reflection (DFB+R) laser includes an active section, a passive section, a low reflection (LR) mirror, and an etalon. The active section includes a distributed feedback (DFB) grating and is configured to operate in a lasing mode. The passive section is coupled end to end with the active section. The LR mirror is formed on or in the passive section. The etalon includes a portion of the DFB grating, the passive section, and the LR mirror. The lasing mode of the active section is aligned to a long-wavelength edge of a reflection peak of the etalon.

24 Claims, 9 Drawing Sheets

(56) References Cited

U.S. PATENT DOCUMENTS

| | | | |
|---|---|---|---|
| 2010/0265980 A1 * | 10/2010 | Matsuda | B82Y 20/00 |
| | | | 372/46.01 |
| 2010/0272133 A1 * | 10/2010 | Kato | H01S 5/06256 |
| | | | 372/20 |
| 2011/0299561 A1 * | 12/2011 | Akiyama | H01S 5/02325 |
| | | | 385/10 |
| 2013/0308178 A1 * | 11/2013 | Matsui | H01S 5/06256 |
| | | | 359/344 |
| 2014/0269807 A1 | 9/2014 | Matsui | |
| 2016/0064897 A1 * | 3/2016 | Higa | H01S 5/1225 |
| | | | 372/50.11 |
| 2016/0164257 A1 * | 6/2016 | Adachi | H01S 5/1231 |
| | | | 438/31 |
| 2017/0256912 A1 * | 9/2017 | Matsui | H01S 5/141 |
| 2020/0044415 A1 * | 2/2020 | Matsui | H01S 5/141 |
| 2021/0098967 A1 * | 4/2021 | Matsui | H01S 5/06256 |
| 2021/0098970 A1 * | 4/2021 | Matsui | H01S 5/125 |
| 2022/0102939 A1 * | 3/2022 | Matsui | H01S 5/4056 |
| 2022/0140569 A1 * | 5/2022 | Matsui | H01S 5/0287 |
| | | | 372/28 |
| 2022/0393427 A1 * | 12/2022 | Matsui | H01S 5/0427 |
| 2024/0047939 A1 * | 2/2024 | Matsui | H01S 5/028 |
| 2025/0047068 A1 * | 2/2025 | Debregeas | H01S 5/1203 |

OTHER PUBLICATIONS

Dumitrescu, et al., "Distributed Feedback Lasers with Photon-Photon-Resonance-Enhanced Modulation Bandwidth" Semiconductor Conference, 2012 International IEEE, Oct. 15, 2012, 4 pgs.

Radziunas, et al., "Improving the Modulation Bandwidth in Semiconductor Lasers by passive Feedback," IEEE Journal of Selected Topics in Quantum Electronics, IEEE Service Center, vol. 13, No. 1, Jan. 1, 2007, 8 pgs.

Troppenz, et al., "40 Gbit/s Directly Modulated Lasers: Physics and Application" Proc. SPIE 7953, Novel In-Plane Semiconductor Lasers X, 79530F (Feb. 16, 2011) 10 pgs.

Chacinski, et al., "Effects of detuned loading on the modulation performance of widely tunable MG-Y lasers," Proc. SPIE 6997, Semiconductor Lasers and Laser Dynamics III, 699709 (May 8, 2008) 9 pgs.

Yamaoka, et al. "239.3-Gbit/s Net Rate PAM-4 Transmission Using Directly Modulated Membrane Lasers on High-Thermal-Conductivity SiC" The 45th European Conference on Optical Communication, Dublin, Sep. 22-26, 2019 4pgs.

* cited by examiner

(a) 120 um passive WG

(b) 30 um passive WG

80

(a) 120 um passive waveguide

90

(b) 30 um passive waveguide

BANDWITH ENHANCED DFB+R LITE LASER

BACKGROUND OF THE DISCLOSURE

Lasers are useful in several applications. For example, lasers may be used in optical communications to transmit digital data across a fiber-optic network. The laser may be modulated by a modulation signal, such as an electronic digital signal, to produce an optical signal transmitted on a fiber optic cable. An optically sensitive device, such as a photodiode, is used to convert the optical signal to an electronic digital signal transmitted through the fiber-optic network. Such fiber optic networks enable modern computing devices to communicate at high speeds and over long distances.

In various industries, bitrates for data transmission per channel have surpassed 100 gigabits per second (Gb/s), establishing transmitter performance exceeding 60 gigahertz (GHz) bandwidth (BW) as an industry goal for the 100 Gb/s non-return-to-zero (NRZ) format. Although some electro-absorption modulators have exhibited the capability to approach 60 GHz BW, the BW of directly modulated lasers (DML) such as directly modulated DFB lasers have lagged behind at approximately 30 GHz.

FIG. 1 illustrates a prior art DFB laser 10 with a passive section 12 and a DFB section 14. The DFB laser 10 may be referred to as a passive feedback laser (PFL) 10. The DFB section 14 includes a DFB grating 16 etched into a multiple quantum well (MQW) gain layer 18. A high reflection (HR) mirror 20 (e.g., with a reflectivity of 95%) is formed on a rear facet of the passive section 12. An anti-reflection (AR) coating 22 is formed on a front facet of the DFB section 14.

An etalon 24 is formed in the passive section 12 by the HR mirror 20 and a portion of the DFB grating 16 at the rear of the DFB section 14. The DFB grating 16 has a strong kappa of about 500 cm$^{-1}$. Strong reflection from the HR mirror 20 degrades the side-mode suppression ratio (SMSR) unless a strong kappa is used.

The configuration of the DFB laser 10 with the HR mirror 20 and the DFB grating 16 with strong kappa excites an external cavity mode that can resonantly amplify the modulation sidebands of the DFB mode (e.g., the photon-photon resonance (PPR) effect), resulting in a 37 GHz modulation BW at 1310 nm. The speed improvement in the DFB laser 10 is mainly due to the PPR effect, and the carrier-photon resonance frequency (F$_r$) is relatively low, e.g., 12 GHz. The strong kappa of the DFB grating 16 stabilizes the DFB mode even when the HR mirror 20 produces strong feedback.

The DFB grating 16 is etched directly into the MQW layer 18 which may degrade gain properties and reliability. The MQW layer 18 may include InGaAsP; InGaAlAs cannot be used in the MQW layer 18 due to Al oxidation. The strong kappa of the DFB grating 16 in the DFB laser 10 further reduces or eliminates the detuned-loading effect in the DFB laser 10. In particular, the strong kappa reduces the influence of reflected light on the threshold gain of the active section 14.

FIG. 2 illustrates a reflection profile 26 of the etalon (24) for the DFB laser (10) in FIG. 1. The reflection profile 26 is substantially flat due to the HR mirror (20). In particular, the etalon (24) works as an all-pass filter or Gires-Tournois (GT) interferometer, which generally modifies dispersion as a function of wavelength but does not generally modify reflection as a function of wavelength. As a result of the flatness of the reflection profile caused by the HR mirror (20), there is insufficient filter edge to which the lasing mode may be aligned to provide a pronounced detuned-loading effect, substantially eliminating the detuned-loading effect in the DFB laser (10).

In Pulse Amplitude Modulation 4-level (PAM4) transmission, multilevel signal modulation transmits optical signals in which each of four amplitude levels represents 2 bits of logic information (e.g., 00, 01, 11, 10). To support 100 Gb PAM4 transmission, a resonance frequency (Fr) of a DFB laser needs to be greater than about 25 GHz (70 C). However, conventional DFB lasers cannot meet this requirement.

The subject matter of the present disclosure is directed to overcoming, or at least reducing the effects of, one or more of the problems set forth above.

SUMMARY OF THE DISCLOSURE

A distributed feedback plus reflection (DFB+R) laser disclosed herein comprises a distributed feedback (DFB) and a passive section. The DFB section has a first length between 60 to 150 microns and has a high reflection (HR) element. The passive section is coupled to the DFB section. The passive section has a second length between 30 to 80 microns and has a low reflection (LR) element opposite the DFB section. The DFB+R laser is directly modulated and is configured to operate uncooled. A portion of the DFB section, the passive section, and the LR element form an etalon having a reflection profile with periodic peaks and valleys, and the DFB section is configured to operate in a lasing mode aligned to a long-wavelength edge of one of the periodic peaks of the reflection profile of the etalon.

A method disclosed herein comprises: directly modulating a distributed feedback plus reflection (DFB+R) laser in uncooled operation; generating laser light in a distributed feedback (DFB) section of the DFB+R laser having a first length between 60 to 150 microns and having a high reflection (HR) element; coupling the laser light from the DFB section to a passive section having a second length between 30 to 80 microns and having a low reflection (LR) element; resonating the laser light in an etalon formed by a portion of the DFB section, the passive section, and the LR element, the etalon having a reflection profile with periodic peaks and valleys; and operating the DFB section in a lasing mode aligned to a long-wavelength edge of one of the periodic peaks of the reflection profile of the etalon.

The foregoing summary is not intended to summarize each potential embodiment or every aspect of the present disclosure.

DETAILED DESCRIPTION OF THE DISCLOSURE

Some example embodiments described herein generally relate to a distributed feedback (DFB) laser with weak optical feedback, also referred to as a DFB plus reflection (DFB+R) laser.

In an example embodiment, a DFB+R laser includes a DFB section, a high reflection (HR) mirror, a passive section, and a low reflection (LR) mirror. The DFB section is configured to operate in a lasing mode. The HR mirror is coupled to a rear of the DFB section. The passive section is coupled to a front of the DFB section. The LR mirror is formed at a front of the passive section. The passive section, a portion of the DFB section at the front of the DFB section, and the LR mirror form an etalon having a reflection profile with periodic peaks and valleys. The lasing mode of the DFB section is aligned to a long-wavelength edge of one of the periodic peaks of the reflection profile of the etalon.

Embodiments described herein leverage the detuned-loading effect to improve the performance of the DFB laser by including a passive section with weak optical feedback in the DFB laser. The detuned loading effect will first be described in the context of a distributed Bragg reflector (DBR) laser followed by a discussion of its applicability to DFB lasers.

Figures 1, 2:
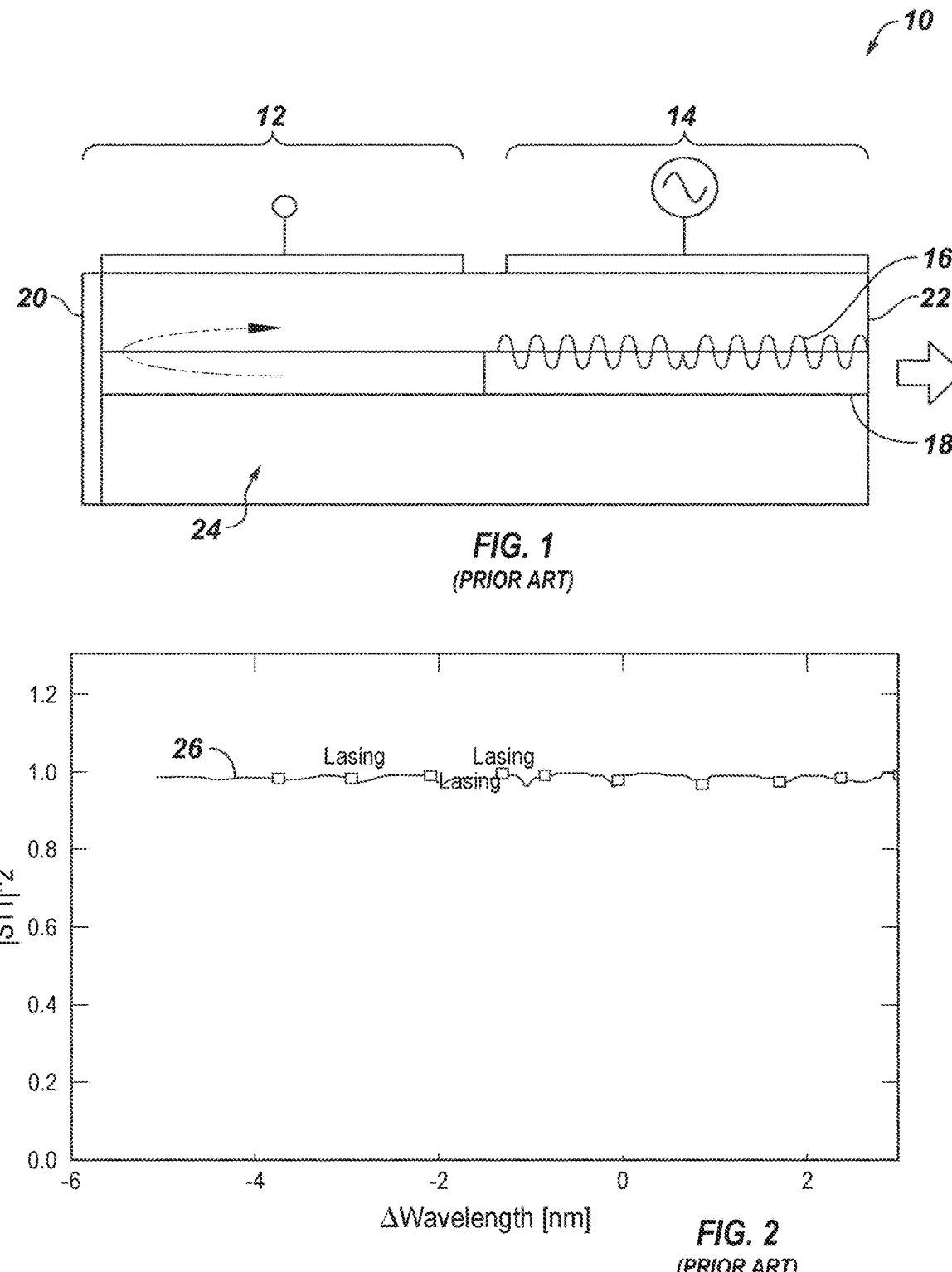
FIG. 1 illustrates a prior art DFB laser with a passive section and a DFB section.
FIG. 2 illustrates a reflection profile of an etalon for the DFB laser according to the prior art.
Figure 3:
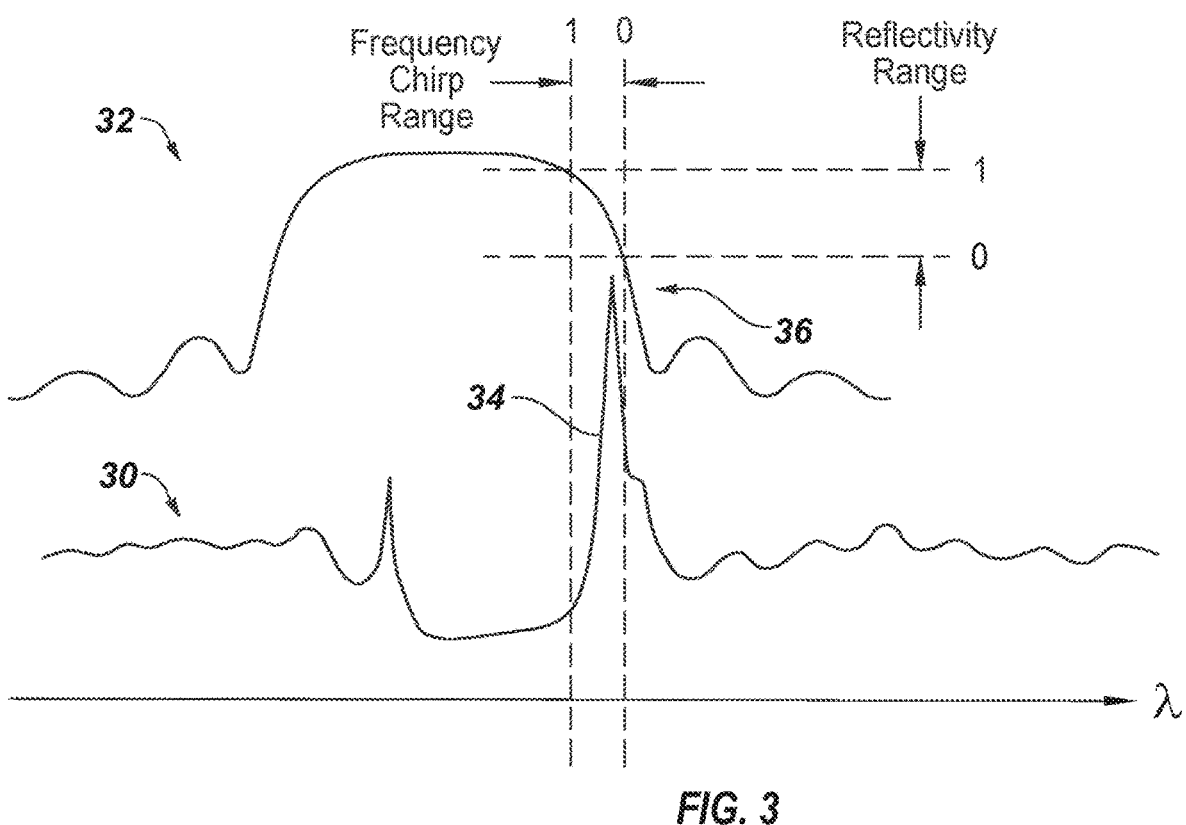
FIG. 3 illustrates an example modulation spectrum of an active section of a laser relative to a DBR reflection profile of a DBR section of the laser.

FIG. 3 illustrates an example modulation spectrum 30 of an active section of a DBR laser. This modulation spectrum 30 is shown relative to a DBR reflection profile 32 of a DBR section of the DBR laser. As illustrated, a main lasing mode 34 of the modulation spectrum 30 is aligned to a long wavelength edge 36 of a peak of the DBR reflection profile 32. Accordingly, lasing of the active section occurs at a frequency (or wavelength) on the long-wavelength edge of the DBR stop-band.

When the DBR laser is modulated (e.g., through modulation of the active section), lasing frequency changes due to frequency chirp toward a shorter wavelength as the modulation goes from the bias for the 0 bits to the bias for the 1 bits and towards a longer wavelength as the modulation goes from the bias for the 1 bits to the 0 bits. The frequency/wavelength of the main lasing mode 34 for each of the 1 and 0 bits is designated in FIG. 3 by a corresponding vertical dashed line labeled with, respectively, a 1 or a 0.

The frequency chirp caused by the modulation results in a change in reflection as the main lasing mode 34 moves up and down the long-wavelength edge of the reflection profile 32. In particular, when the modulation goes from the bias for the 0 bits to the 1 bits, the wavelength of the main lasing mode 34 shifts toward a shorter wavelength resulting in increased reflection and thus lower cavity loss. When the modulation goes from the bias for the 1 bits to the 0 bits, the wavelength of the main lasing mode shifts toward a longer wavelength resulting in decreased reflection and thus higher cavity loss. The reflectivity of the DBR region of the DBR laser at the wavelengths corresponding to each of the 1 and 0 bits is designated in FIG. 3 by a corresponding horizontal dashed line labeled with, respectively, a 1 or a 0.

In more detail, rapid current modulation of the active section of the DBR laser induces carrier density variations in the DBR laser. This gives rise not only to optical gain fluctuations but also index fluctuations due to the so-called alpha-parameter of the material. These gain and index-fluctuations give in turn rise to intensity and frequency fluctuations of the laser light, respectively. The relative amount of frequency modulation compared to the intensity modulation of the laser is described by the chirp factor, also called the alpha-parameter or linewidth enhancement factor of the structure.

When the DBR laser is detuned so that the lasing mode 34 is located on the long-wavelength edge of the peak of the reflection profile 32, the index modulation gives rise to modulation of the cavity losses which decreases or increases the effective (net gain) modulation of the laser. Thus, laser chirp is translated into an effective enhancement of the differential gain, and thus improves the speed of the DBR laser. The detuned-loading effect includes the effect(s) that occur under modulation when the lasing mode 34 is aligned to the long-wavelength edge of the peak of the DBR reflection profile 32, which may include one or more of effective enhancements of the differential gain, improved speed, and increased bandwidth.

The detuned-loading effect described above is not limited to DBR lasers. Indeed, the detuned-loading effect may be implemented in semiconductor lasers in which the lasing mode is aligned to the long-wavelength edge of a peak of a reflection profile of a portion of a semiconductor laser according to the present disclosure.

However, embodiments described herein may not need to leverage a photon-photon resonance (PPR) effect. The PPR effect is briefly discussed. In particular, when a directly modulated laser (DML), such as a DFB laser or a DBR laser, is modulated, modulation sidebands broaden the spectrum of the DML around the main lasing mode. If the side mode of the laser cavity is present within the modulation spectrum, such sidebands can be coupled into the side mode and be resonantly amplified.

Figure 4:
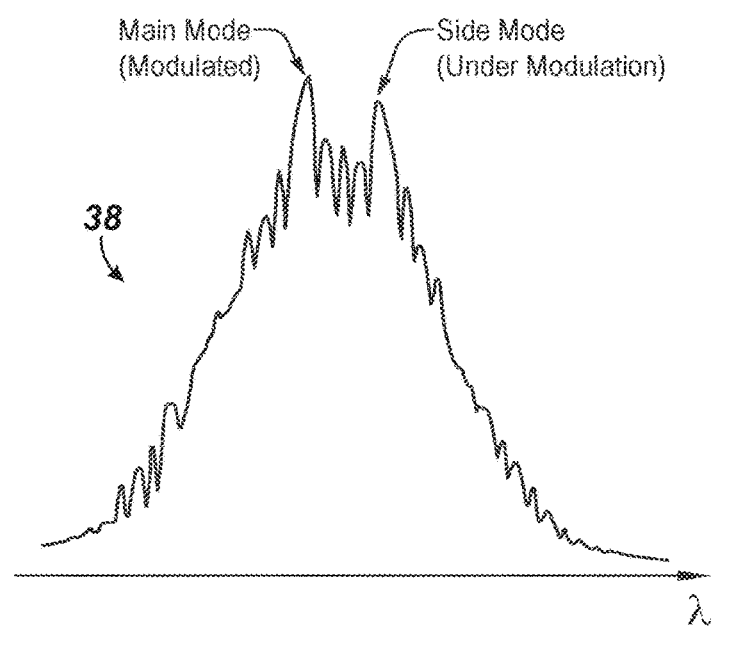
FIG. 4 illustrates a directly modulated laser (DML) modulation spectrum with the photon-photon resonance effect.

This situation is depicted in graph 38 in FIG. 4. This effect is called the photon-photon resonance (PPR) effect and can enhance the modulation response at around a frequency corresponding to the frequency difference between the main and side modes. The frequency separation between the lasing mode and the PPR mode may be referred to as the photon-photon resonance (PPR) frequency.

Understanding the de-tuning effect and the PPR effect, the discussion turns to a DFB plus weak reflection (DFB+R) (e.g.) laser according to the prior art that leverages the de-tuning effect and the PPR effect.

Figures 5, 6:
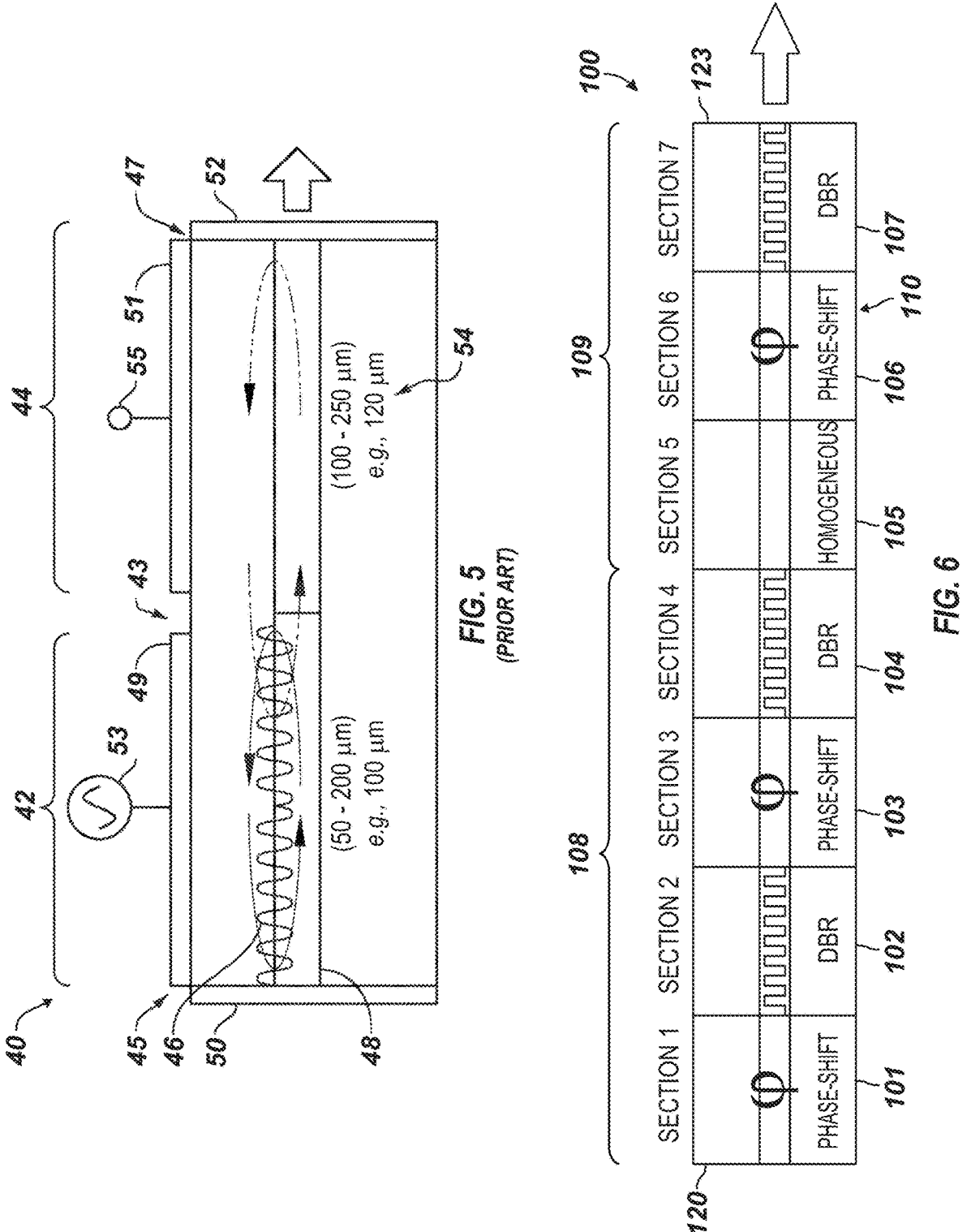
FIG. 5 illustrates an example of a prior art DFB+R laser configured to leverage a detuned-loading effect.
FIG. 6 schematically illustrates a modified DFB+R laser according to the present disclosure for leveraging the detuned-loading effect.

FIG. 5 illustrates an example DFB+R laser 40 configured to leverage the detuned-loading effect as disclosed in U.S. Pat. No. 11,251,585 and disclosed in co-pending U.S. application Ser. No. 17/647,227, which are incorporated herein by reference in its entirety. This DFB+R laser 40 is configured for cooled operation using conventional cooling techniques for a semiconductor laser in an assembly.

As illustrated, the DFB+R laser 40 includes a DFB section 42 (also referred to as an active section) and a passive section 44. The passive section 44 is coupled to a front 43 of the DFB section 42. The passive section 44 has a length in a range from 100 μm to 250 μm (microns or micrometers), such as 120 μm. The DFB section 42 may have a length in a range from 50 μm to 200 μm, such as 100 μm.

The DFB section 42 includes a DFB grating 46 formed in, on, or above an MQW gain layer 48 or another suitable gain layer. The DFB grating 46 can include first and second grating portions with a phase shift in between. An HR mirror 50 having high reflectivity is formed at a rear or back (e.g., on rear facet 45) of the DFB section 42. A low reflection (LR) mirror 52 is formed at a front 47, e.g., on a front facet, of the passive section 44.

An etalon 54 is formed between a portion of the DFB grating 46 at the front of the DFB section 42 and the LR mirror 52. The DFB laser 40 forms a complex-cavity design consisting of a DFB laser itself (e.g., the DFB section 42) and the etalon 54. The etalon 54 is configured to modify cavity loss dynamically due to frequency chirp as the DFB section 42 is modulated.

The DFB+R laser 40 additionally includes a modulation contact 49 and a bias contact 51 electrically coupled to, respectively, the DFB section 42 and the passive section 44. A modulation signal 53 provided through the modulation contact 49 to the DFB section 42 modulates the DFB section 42. A bias signal 55 is provided through the bias contact 51 to the passive section 44. Modulation of the DFB section 42 modulates the cavity loss of the DFB+R laser 40 and may increase the resonance frequency $F_r$ of the DFB+R laser 40.

In general, the DFB+R laser 40 for cooled operation can have a passive waveguide length of about 120 μm integrated with the LR mirror 52 with a reflection of about 3% on the front facet 47 to produce the detuned-loading effect. This arrangement can enhance the detuned-loading effect for the resonance frequency Fr to about 40 GHz and can produce a photon-photon resonance (PPR) effect at about 70 GHz, realizing about 75 GHz bandwidth (BW).

However, as discussed below with reference to FIG. 7A, typically two "mode hops" happen in the Light-Current (L-I) curve for this DFB+R laser 40. For this reason, the arrangement in this DFB+R laser 40 may not be suitable for uncooled operation. Instead, the DFB+R laser 40 of FIG. 5 can be used for 200 G-400 G applications under cooled conditions by achieving about 60 GHz BW or more. In contrast, a modified DFB+R laser according to the present disclosure can be dedicated to other applications, such as 100 G, under uncooled conditions where a bandwidth of about 30 GHz or greater is stably produced without temperature control.

FIG. 6 shows a schematic view of a modified DFB+R laser 100 according to the present disclosure that is directly modulated and is operated uncooled. The modified DFB+R laser 100 has a DFB section 108 and a passive section 109. For uncooled 100 Gb PAM4 applications, for example, it is preferred to suppress the mode hop in the L-I curve while a resonance frequency Fr of about 25 GHz is still achieved.

To achieve the uncooled operation according to the present disclosure, the modified, uncooled DFB+R laser 100 has a much shorter length of the passive section 109 than the cooled DFB+R laser (40) of FIG. 5. In the DFB+R laser 100, the length of the passive section 109 can be in a range of 30 μm to 80 μm, which is shorter than the 100 μm to 250 μm of the passive section (44) in the cooled DFB+R laser (40) of FIG. 5. The length of the DFB section 108 for the uncooled DFB+R laser 100 can be between 60 μm to 120 μm, as opposed to the 50 μm to 200 μm length for the cooled DFB+R laser (40) of FIG. 5.

The shorter length of the passive section 109 can prevent the mode hop in the L-I curve for the uncooled DFB+R laser

100 of the present disclosure. Such a short passive section 109 (preferably about 30 μm) stabilizes the operation not only in uncooled conditions but also stabilizes against the perturbation during aging. As discussed below, such a short length of the passive section 109 is enough to realize a resonance frequency Fr of greater than 25 GHz in uncooled operation.

As depicted, the modified DFB+R laser 100 includes multiple regions 101 to 107. The regions 101 to 104 are DFB regions of a DFB section 108. These regions 101 to 104 consist of MQW active material with a grating having a kappa of about 175 cm⁻¹. The DFB grating can include first and second grating regions 102, 104 with a phase shift region 103 in between. As shown here, the region 103 can introduce a λ/4 phase shift. The DFB lengths of regions 102 and 104 are about 16 μm and 64 μm, respectively.

Region 105 is a passive waveguide section that forms an external feedback cavity with the final region 107. No phase shift may be generated in region 106 of the passive section 109. In the final region 107, a very short (about 12 μm) grating can be written to produce about 4% reflection. Other lower reflection elements can be used as discussed later. A portion of the DFB section 108, the passive section 109, and a low reflection (LR) element 123 form an etalon 110 having a reflection profile with periodic peaks and valleys.

In this example, the same grating strength (K of about 175 cm⁻¹) is assumed. Due to the short grating length, the bandwidth of the Bragg mirror is about 20 nm. AR coating 123 can be applied on the front facet, and a high reflection (HR) coating or another HR element 120 can be applied to the back facet on the DFB section 108.

Figure 7A:
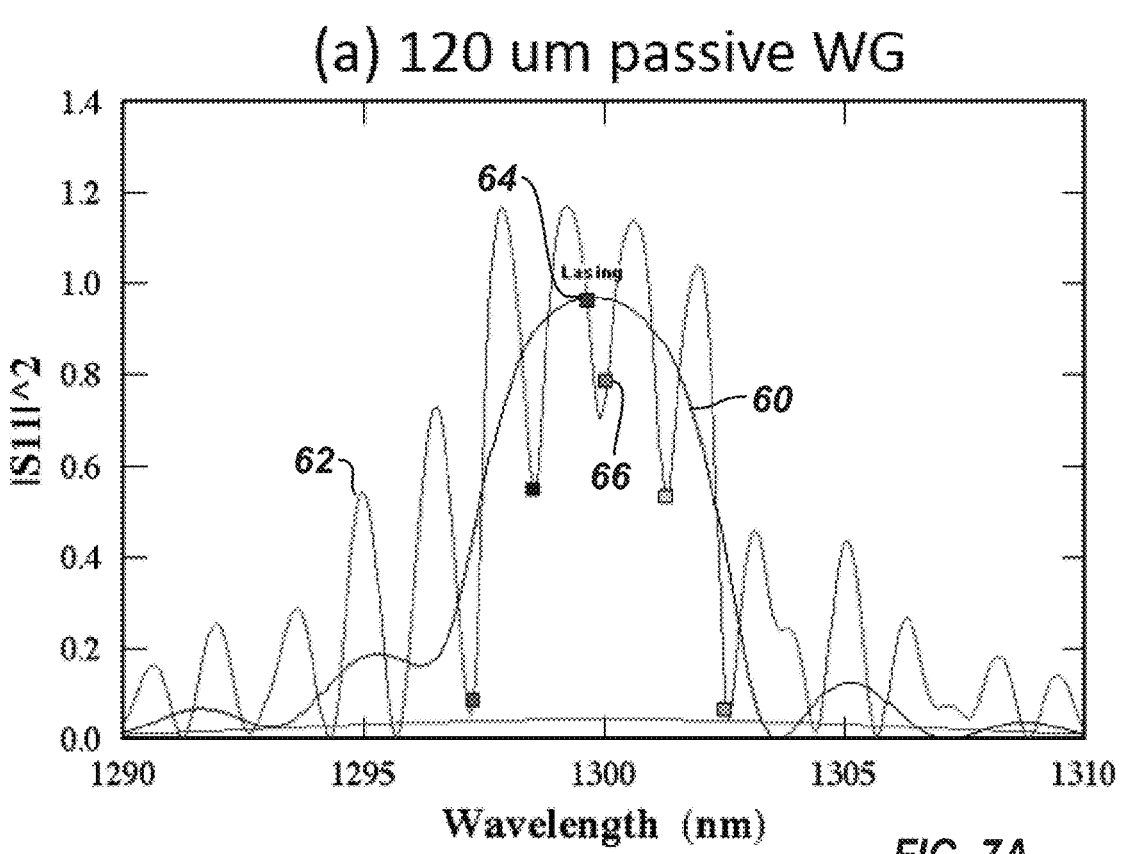
FIG. 7A illustrates a graph for a DFB+R intra-cavity etalon filter for the prior art DFB+R laser of FIG. 5.
Figure 7B:
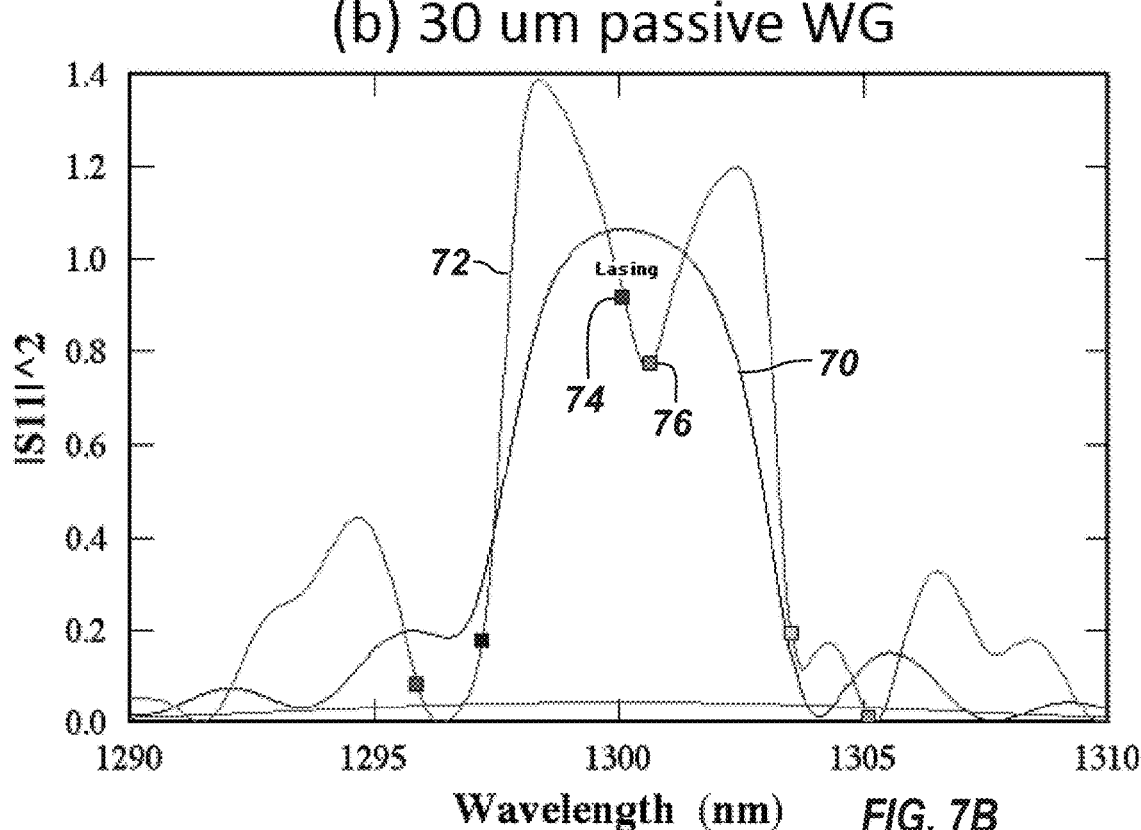
FIG. 7B illustrates a graph for a DFB+R intra-cavity etalon filter for the modified DFB+R laser of FIG. 6.

FIG. 7A illustrates a profile 62 for a DFB+R intra-cavity etalon (54) with a longer 120 μm passive length according to the cooled DFB+R laser (40) of FIG. 5. In contrast, FIG. 7B illustrates a profile 72 for a DFB+R intra-cavity etalon (110) with a shorter 30 μm passive length according to the uncooled DFB+R laser (100) of FIG. 6. Traces 60, show the DFB stopband when there is no reflection. Points 64, 74 show the locations of the main lasing mode, and points 66, 76 show the locations of the PPR mode.

In FIG. 7A, for example, trace 60 is that of the DFB grating (46; FIG. 5). However, the profile 62 is of the combined DFB grating (46) and the LR mirror (52) (with a reflectivity of 3%) so this profile is referred to hereinafter as a combined DFB+R reflection profile 62 when seen from the DFB section (54) toward the output of the DFB+R laser (40). As illustrated by the DFB+R reflection profile 62, the etalon (54) formed by the DFB grating (46) and the LR mirror (52) produces strong ripples and hence a strong detuned-loading effect.

In FIG. 7B, the trace 70 shows the intra-cavity etalon filter profile formed between the DFB grating (regions 102, 104; FIG. 6) and the front facet reflection by the region (107). The periodicity of the ripples corresponds to the free spectral range (FSR) of the etalon filter, which is determined by the length of the passive waveguide in the region (105).

As evidenced by the profile 60 in FIG. 7A, the corresponding FSR for the conventional DFB+R laser (40) having a passive length of 120 μm is about 256 GHz. As evidenced by the profile 70 in FIG. 7B, however, the corresponding FSR for the modified DFB+R laser (100) having a passive length of 30 μm is about 630 GHz.

As noted, the points 64, 74 indicate the main lasing mode and are positioned on the slope of the etalon filter. At this location, when the laser (40, 100) is modulated, the chirp moves the lasing mode 64, 74 toward the shorter wavelength where the loss of the etalon filter is reduced (the mirror reflectivity increases). This means that an FM-AM conversion through the etalon filter creates an effective net positive gain, which enhances the resonant frequency $F_r$. This effect is called the detuned-loading effect noted above.

Figure 8A:
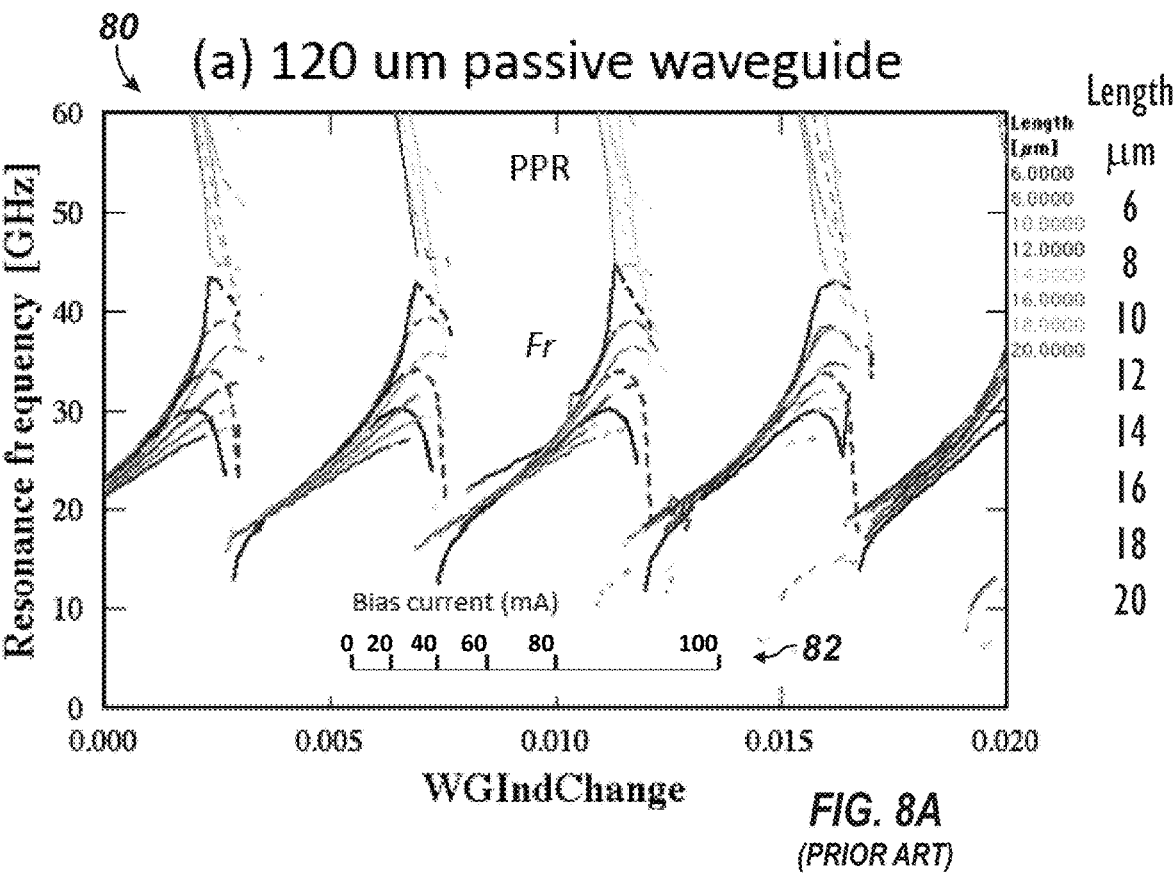
FIG. 8A illustrates a graph of resonant frequency for the prior art DFB+R laser of FIG. 5.
Figure 8B:
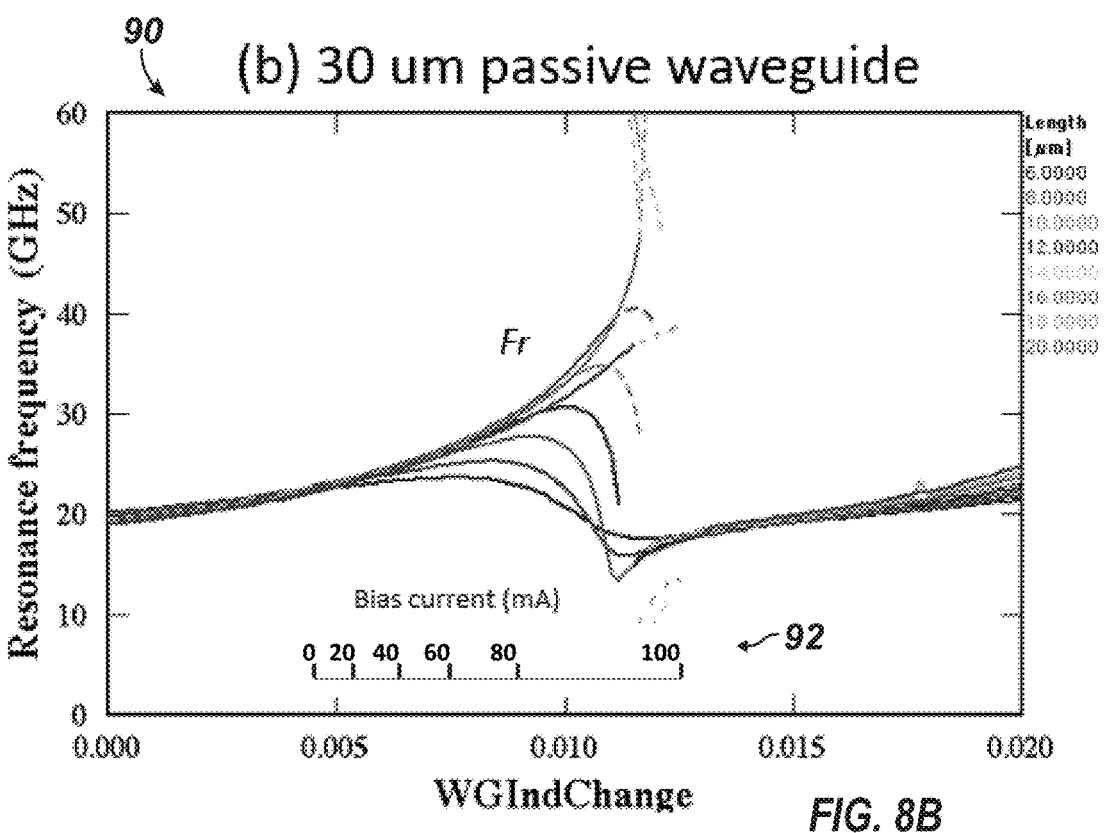
FIG. 8B illustrates a graph of resonant frequency for the modified DFB+R laser of FIG. 6.

FIG. 8A illustrates resonance frequency (Fr) 80 for a prior art DFB+R laser (40; FIG. 5) having a 120 μm passive length, and FIG. 8B illustrates resonance frequency (Fr) 90 for a modified DFB+R laser (100) of the present disclosure with a 30 μm passive length. The horizontal axis (WGInd-Change) is the refractive index change for the DFB section (42, 108) due to Joule heating. The corresponding bias current for an 80 μm DFB length is indicated in the insets 82, 92.

For the prior DFB+R laser (40) having a 120 μm passive length as evidenced in FIG. 8A, it can be seen that a mode hop happens two or three times over the bias range 82 from the threshold to 100 mA. On the other hand, for the modified DFB+R laser (100) of the present disclosure having a 30 μm passive length as evidenced in FIG. 8B, the mode hop happens only once near 100 mA over the bias range 82. For both cases, the maximum resonant frequency $F_r$ is close to 40 GHz. Also, it can be seen that photon-photon resonance (PPR) frequency for prior art DFB+R laser (40) for FIG. 8A is around GHz, which makes this type of laser ideal for 200 Gb PAM4 applications under cooled operations. For uncooled 100 Gb PAM4 applications, however, the required bandwidth is about 30 GHz. Therefore, it is not necessary to utilize the photon-photon resonance (PPR) effect, which is missing for the modified DFB+R laser (100) of the present disclosure corresponding to FIG. 8B.

The advantage of the modified DFB+R laser (100) with a shorter (about 30 μm) passive section (109) is that it is more stable over the refractive index fluctuation over temperature and possibly over the life after aging.

FIGS. 9A-9F schematically illustrate embodiments of a modified DFB+R laser 100 according to the present disclosure. In each embodiment, the modified DFB+R laser 10 includes a DFB section 108 (also referred to as an active section) and includes a passive section 109 coupled to a front of the DFB section 108. The passive section 109 can have a length in a range from about 30 μm to 80 μm, such as 30 μm or 50 μm. The DFB section 108 can have a length in a range of 60 μm to 150 μm, such as about μm to 120 μm or 80 μm to 150 μm. A length for the DFB section 108 of 80 μm to 150 μm may provide a faster response for the laser 100 but have lower output power.

In each embodiment, the DFB section 108 includes a DFB grating 114 formed in, on, or above an MQW gain layer 112 or another suitable gain layer. The DFB grating 114 may include first and second grating portions with a phase shift in between, as noted previously.

Figure 9A:
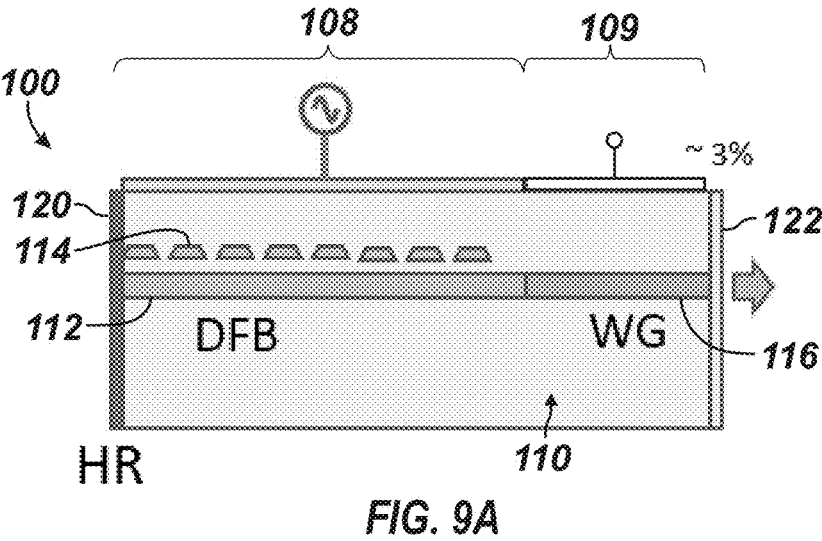
FIGS. 9A-9F schematically illustrate embodiments of a modified DFB+R laser according to the present disclosure.
Figure 9B:
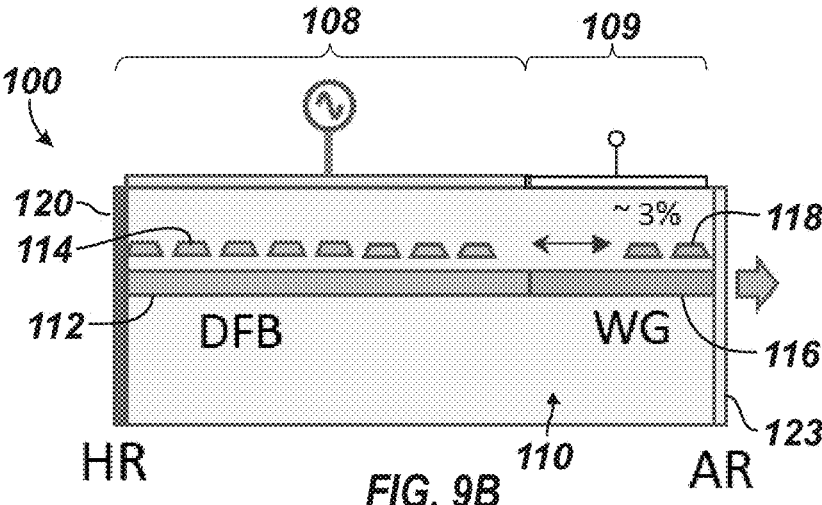
Figure 9C:
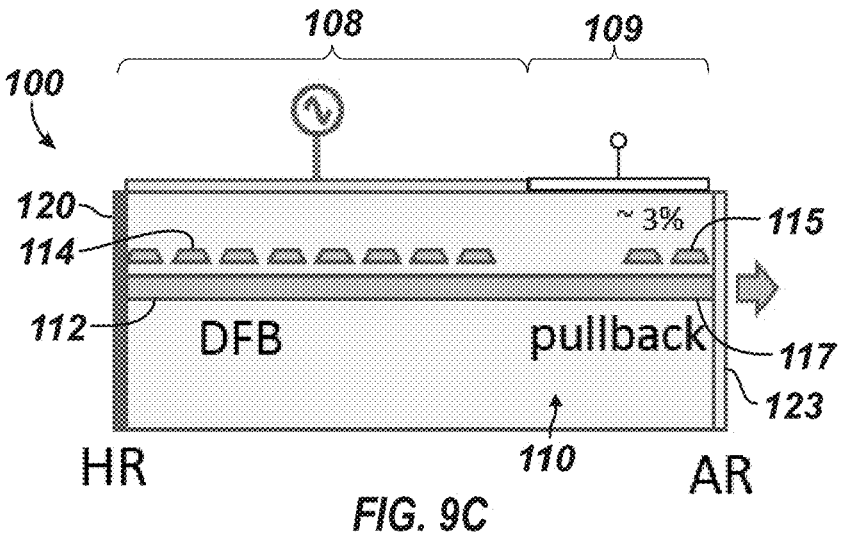
Figure 9D:
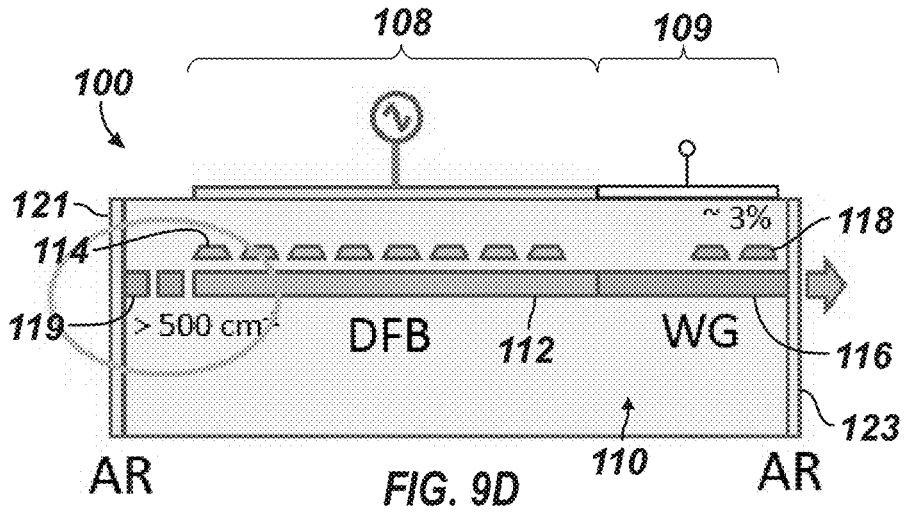
Figure 9E:
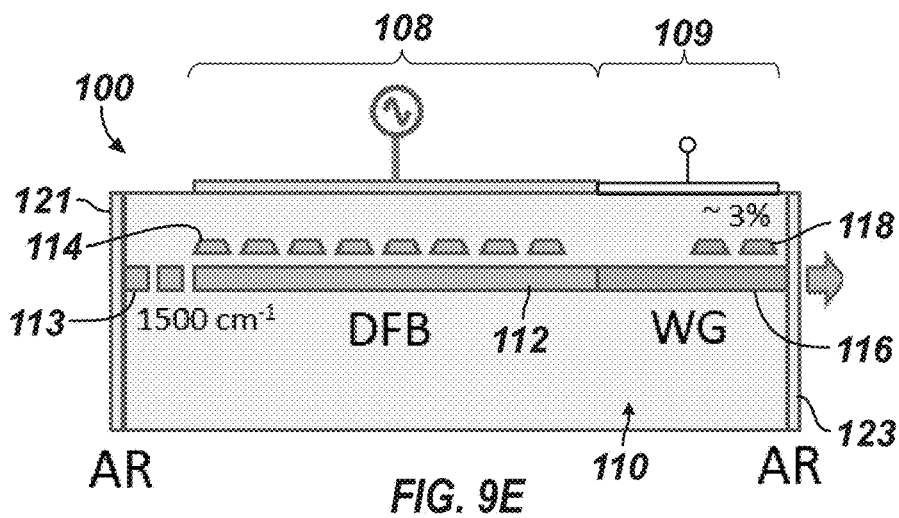
Figure 9F:
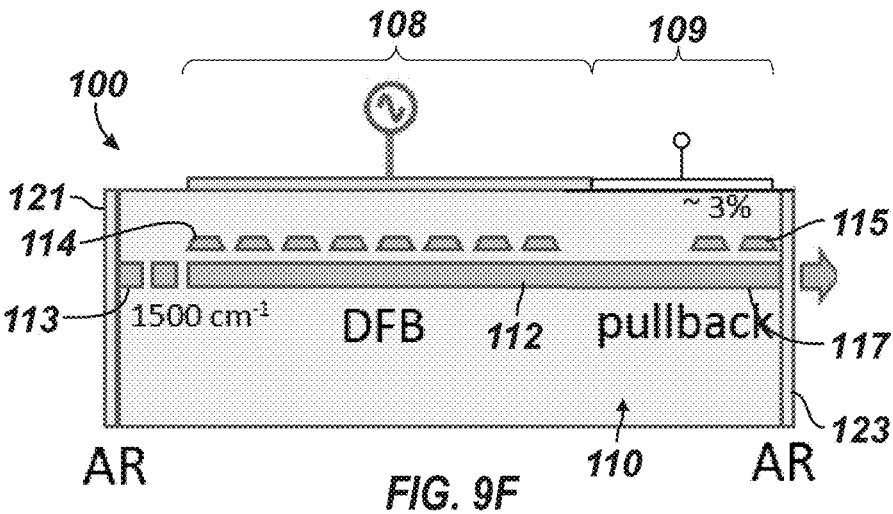

In the embodiments of FIGS. 9A-9C, an HR mirror 120 is formed on (or coupled to) the rear facet of the DFB section 108. The HR mirror 120 can have a reflectivity of 30% or more, 50% or more, 70% or more, or even 90% or more. In other embodiments as shown in FIGS. 9D-9F, a DBR mirror 119, 113 with similar reflectivity (e.g., of 30% or more, 50% or more, 70% or more, or even 90% or more) can be substituted for the HR mirror 120 and can be referred to herein as an HR DBR mirror. The term "HR mirror" as used herein encompasses HR coatings/mirrors as well as HR DBR mirrors.

Cleaving the back facet on the DFB grating 114 in the active section 108 in FIGS. 9A-9C can randomly terminate the grating 114 due to the small pitch of the DFB grating 114. Therefore, the use of the HR DBR mirror 119, 113 in FIGS. 9D-9F may be preferred.

In FIG. 9A, a low reflection (LR) mirror 122 is formed on (or coupled to) a front facet of the passive section 109. The LR mirror 122 can have a reflectivity of 15% or less, 10% or less, or even 5% or less, such as 4% or 3%. In FIGS. 9B-9F, however, a DBR mirror 115, 118 with similar reflectivity (e.g., 3%) can be used, and the front facet can have an antireflection coating 123.

In each of the embodiments of FIGS. 9A-9F, an etalon 110 is formed between a portion of the DFB grating 114 at the front of the DFB section 108 and the LR mirror 122 or DFB mirror 115, 118. The modified DFB laser 100 forms a complex-cavity design consisting of a DFB laser itself, e.g., the DFB section 108, and the etalon 110. The etalon 110 is configured to modify cavity loss dynamically due to frequency chirp as the DFB section 108 is modulated. For this reason, the modified DFB laser 100 can be referred to as a DFB+R (e.g., DFB plus weak reflection) laser, as already mentioned.

As before, the DFB+R laser 100 additionally includes a modulation contact and a bias contact electrically coupled to, respectively, the DFB section 108 and the passive section 109. A modulation signal provided through the modulation contact to the DFB section 108 modulates the DFB section 108. Meanwhile, a bias signal is provided through the bias contact to the passive section 109. Modulation of the DFB section 108 modulates the cavity loss of the DFB+R laser 100 and increases the resonance frequency $(F_r)$ of the DFB+R laser 100.

In FIG. 9A, the DFB section 108 has a length in a range of about 80 μm to 150 μm, and the passive section 109 has a waveguide 116 with a length of about 50 μm. As noted previously in FIGS. 8A-8B, the relative position of the insets 82, 92 for the bias current (inset) relative to the refractive index change (horizontal axis) is not fixed. Instead, the bias current varies due to the random nature of the phase of the light at both front and rear cleaved facets of the laser 100 depicted in FIG. 9A.

In FIG. 9B, the DFB section 108 has a length in a range of about 80 μm to 150 μm, and the passive section 109 has waveguide 116 with a length of about 50 μm. The phase of the light at the front facet 122 is controlled by the grating 118. The typical reflectivity of the grating 118 can be about 3%, which can be realized by the grating 118 having a length of about 12 μm with a grating strength (K) of about 180 cm$^{-1}$. The grating 118 here is written in the front passive waveguide 116.

In FIG. 9C, the DFB section 108 has a length in a range of about 80 μm to 150 μm, and the passive section 109 has a length of about 50 μm. In the passive section 109, a front waveguide is replaced with an un-pumped MQW (pullback) region 117 having a grating 115. This pullback region 117 can simplify the fabrication process because the active section 108 does not need to be butt coupled to a passive waveguide. The typical reflectivity of the grating 115 can be about 3%, which can be realized by the grating 115 having a length of about 12 μm with a grating strength (K) of about 180 cm$^{-1}$. The grating 115 here is written in the un-pumped MQW (pullback) region 117.

In FIG. 9D, the DFB section 108 has a length in a range of about 80 μm to 150 μm, and the passive section 109 has a length of about 50 μm. The phase of the light at the front facet 123 is controlled by a grating 118. The typical reflectivity of the grating 118 can be about 3%, which can be realized by the grating 118 having a length of about 12 μm with a grating strength (kappa κ) of about 180 cm$^{-1}$. The grating 118 is written in the front passive waveguide 116.

The rear facet has an anti-reflection coating 121. Instead of an HR coating, a high reflection grating mirror 119 (~90%) is provided at the back of the MQW gain layer 112. The grating mirror 119 involves kappa κ greater than 500 cm⁻¹, such as 500 cm⁻¹ to 1500 cm⁻¹, with a grating length of about 15 μm.

In FIG. 9E, the DFB section 108 has a length in a range of about 80 μm to 150 μm, and the passive section 109 has a length of about 50 μm. The phase of the light at the front facet is controlled by a grating 118. The typical reflectivity of the grating 118 can be about 3%, which can be realized by the grating 118 having a length of about 12 μm with a grating strength (kappa κ) of about 180 cm⁻¹. The grating 118 is written in the front passive waveguide 116.

The rear facet has an anti-reflection coating 121. Instead of an HR coating, a high reflection grating mirror 113 (~90%) is provided in the MQW gain layer 112. The grating mirror 113 involves K greater than 1500 cm⁻¹ with a grating length of about 15 μm.

Features of the modified DFB+R laser 100 in FIGS. 9C and 9E can be combined to produce the modified DFB+R laser 100 of FIG. 9F. This laser 100 has a pullback region 117 with a grating 115 and has a grating mirror 113 in the MQW gain layer 112.

In the embodiments disclosed herein in which an AR coating is used on the front facet, the reflectivity may not be precisely 0%. Due to fabrication processes, there is usually 0.2%-0.5% residual reflection at the front facet. Moreover, for fabrication purposes, the total cavity length of the modified DFB+R laser 100 is preferably at least 150 μm or longer to guarantee a good cleaving quality at the front facet. Otherwise, the reliability of the modified DFB+R laser 100 can be compromised.

Figure 10A:
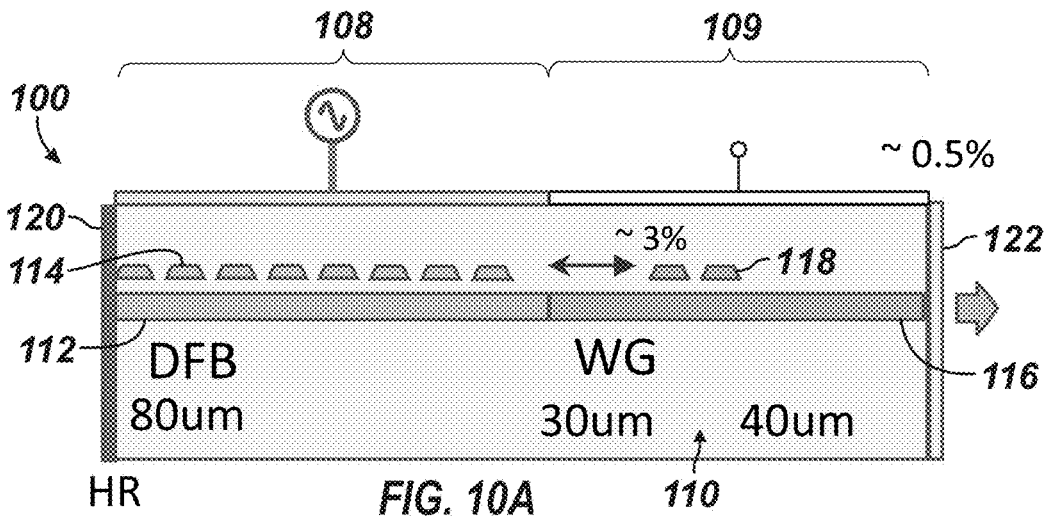
FIGS. 10A-10D schematically illustrate embodiments of a modified DFB+R laser having an etched front facet according to the present disclosure.

Due to these fabrication issues and as shown in FIG. 10A, there may be a gap of about 40 μm between a front grating 118 and the front facet 122 (having about 0.5% residual reflection). (This corresponds to the implementation discussed above with reference to FIG. 9B.) Because this gap cannot be controlled within the order of a wavelength, the feedback phase from the front facet 122 can be random. This can affect the performance yield of the modified DFB+R laser 100.

At least two conventional solutions can be used to counteract this problem. In a first solution, a window structure can be used at the front facet 122. Although feasible, if the cleave facet position is not precisely controlled, the output beam profile can vary. In a second solution, the waveguide 110 can be bent. Bending the waveguide 110 to about a 7-degree angle will require about 80 μm in additional length, which may not be suitable for some implementations.

Figure 10B:
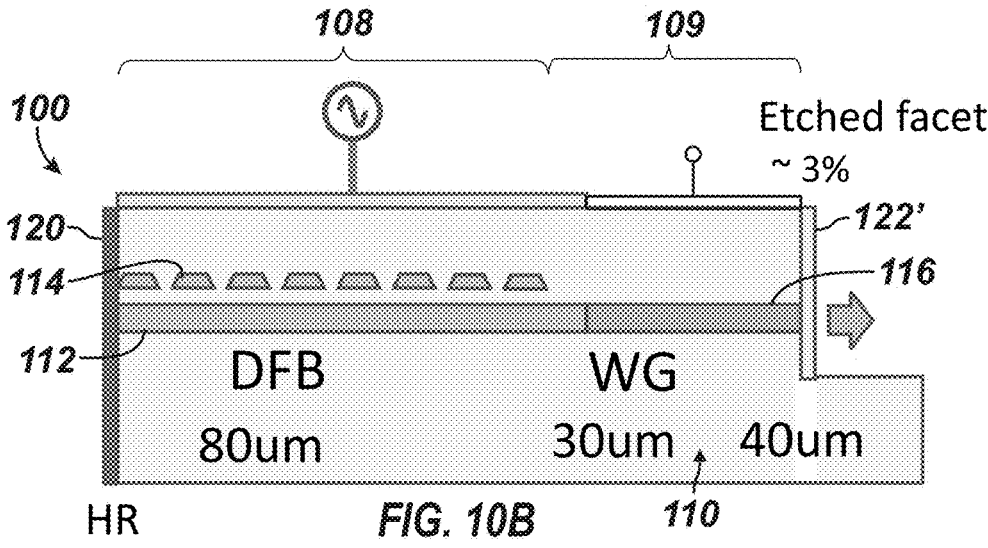
Figure 10C:
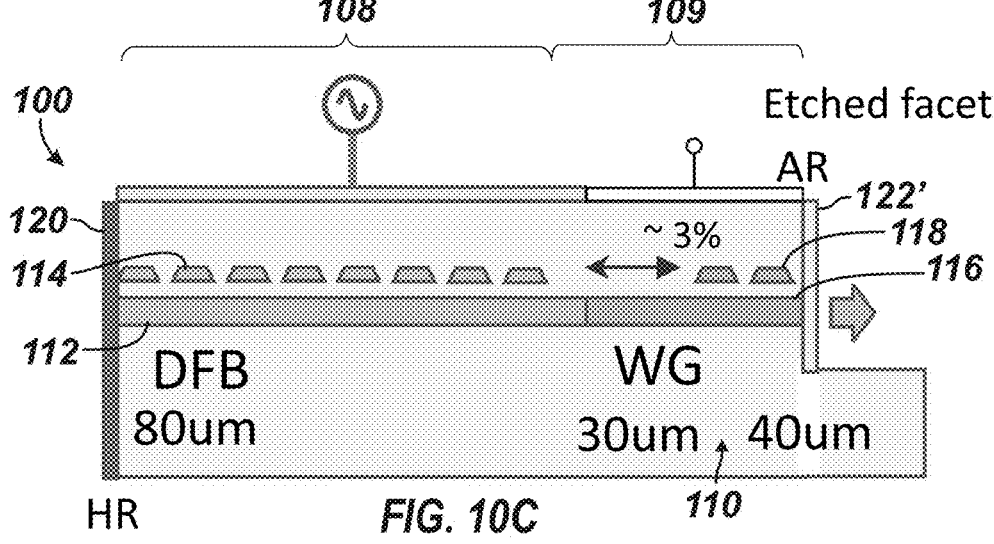
Figure 10D:
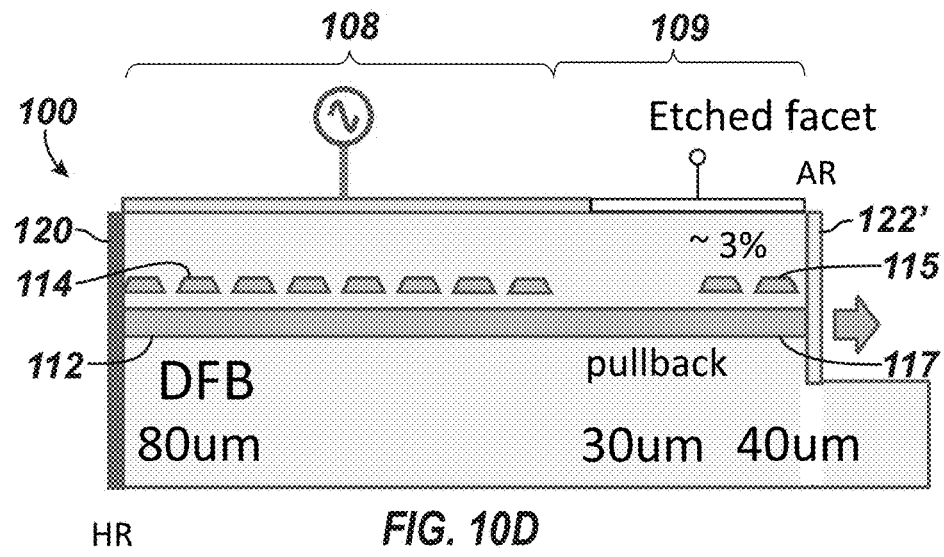

According to the present disclosure, an additional structure can be added to the modified DFB+R laser 100 to solve this issue. As shown in FIGS. 10B-10D, an etched front facet 122' can be formed at the front of the modified DFB+R laser 100, and an anti-reflective coating AR can be applied on the etched front facet 122'.

For example, FIG. 10B shows a solution in which the front of the modified DFB+R laser 100 includes an etched front facet 122' having an anti-reflective AR coating (of about 3% reflectivity). This front facet 122' is defined in a recess etched at a front end of the modified DFB+R laser 100 so that the front facet 112' is offset from the front end. (This laser 100 is similar to that discussed above with reference to FIG. 9A.) For fabrication purposes noted above, the total cavity length of the modified DFB+R laser 100 is preferably at least 150 μm or longer. As shown here, the DFB section 112 has a length of 80 μm, the waveguide 110 has a length of 30 μm, and the etched front facet 122' is etched back or recessed about 40 μm. Although this arrangement is feasible, the phase of the feedback light from the etched front facet 122' may be difficult to control.

FIG. 10C shows another solution in which the front of the modified DFB+R laser 100 includes an etched front facet 122'. (This laser 100 is similar to that discussed above with reference to FIG. 9B.) For fabrication purposes noted above, the total cavity length of the modified DFB+R laser 100 is preferably at least 150 μm or longer. As shown here, the DFB section 112 has a length of 80 μm, the waveguide 110 has a length of 30 μm, and the etched front facet 122' is etched backed or recessed amount of 40 μm. The front facet 122' is coated with anti-reflection AR coating, and an intentional angle used at the etched facet 122' can further reduce the reflection. Here, a DBR grating 118 having a reflectivity of about 3% is included on the waveguide 110 at the etched front facet 122'. The phase of the feedback light from the etched front facet 122' is controlled by the front DBR grating 118 more preferably compared to the arrangement in FIG. 10B.

FIG. 10D shows yet another solution in which the front of the modified DFB+R laser 100 includes an etched front facet 122'. (This laser 100 is similar to that discussed above with reference to FIG. 9C.) For fabrication purposes noted above, the total cavity length of the modified DFB+R laser 100 is preferably at least 150 μm or longer. In the passive section 109, a front waveguide is replaced with an un-pumped MQW (pullback) region 117. As shown here, the DFB section 112 has a length of 80 μm, the pullback region 117 has a length of 30 μm, and the etched front facet 122' is etched backed or recessed amount of 40 μm.

The front facet 122' can be coated with anti-reflection AR coating, and an intentional angle used at the etched facet 122' can further reduce the reflection. Here, in the passive section 109, a grating 115 is written in the un-pumped MQW (pullback) region 117. The phase of the feedback light from the etched front facet 122' is controlled by this grating 115.

Figure 11A:
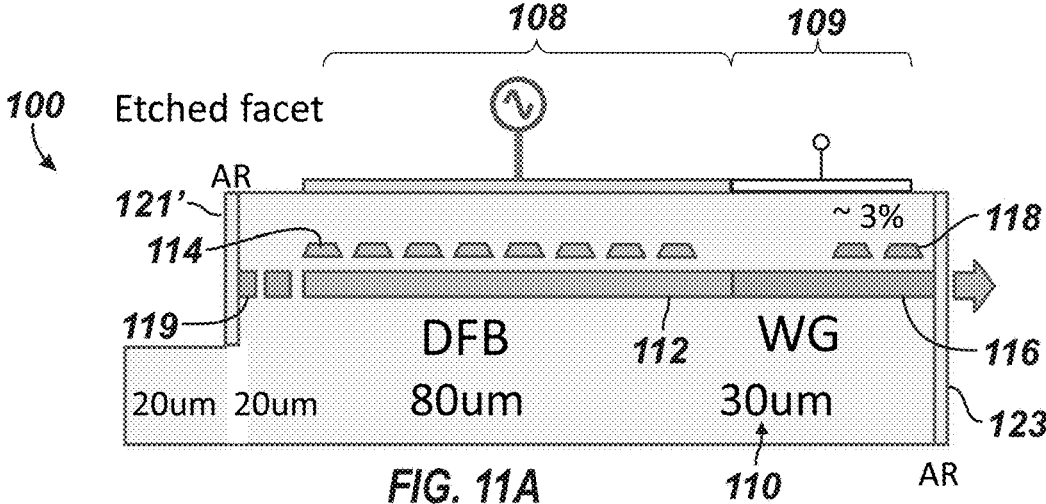
FIGS. 11A-11B schematically illustrate embodiments of a modified DFB+R laser having an etched rear facet according to the present disclosure.

FIG. 11A shows a solution in which the back of the modified DFB+R laser 100 includes an etched rear facet 121'. In particular, a rear end of the DFB+R laser 100 has a recess etched therein, and the recess has a rear facet 121' offset from the rear end. The rear facet 121' can have an anti-reflective coating. (This laser 100 is similar to that discussed above with reference to FIG. 9D.) For fabrication purposes noted above, the total cavity length of the modified DFB+R laser 100 is preferably at least 150 μm or longer. As shown here, the DFB section 112 has a length of 80 μm, and the waveguide 110 has a length of 30 μm. The phase of the light at the front facet 123 is controlled by a grating 118 written in the front passive waveguide 116. The typical reflectivity of the grating 118 can be about 3%.

The etched rear facet 121' is etched backed or recessed amount of 20 μm, and the etched rear facet 121' can be defined at a slight angle. Instead of an HR coating, the etched rear facet 121' has an anti-reflection coating AR, and a high reflection grating mirror 119 (~90%) of a length of about 20 μm is provided at the back of the MQW gain layer 112.

Figure 11B:
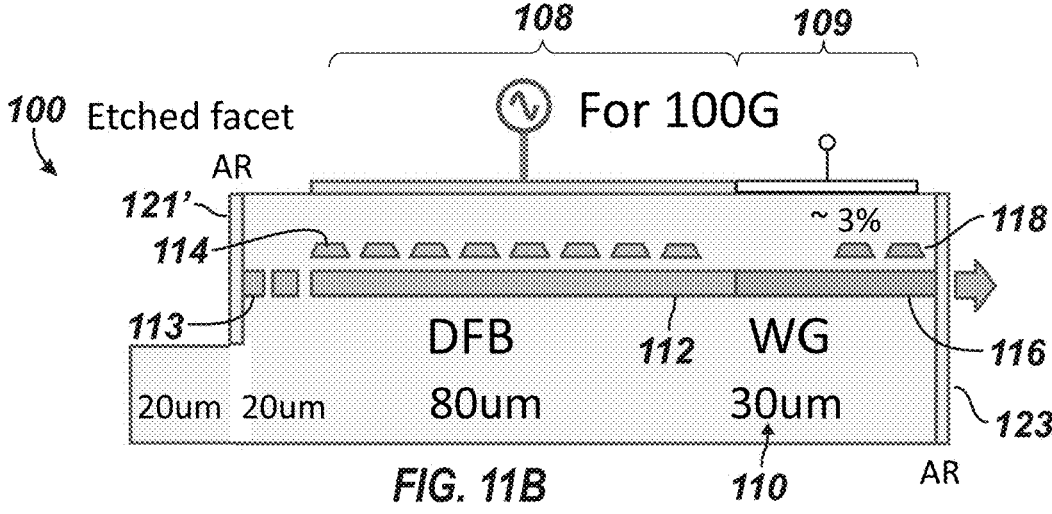

FIG. 11B shows another solution in which the back of the modified DFB+R laser 100 includes an etched rear facet 121'. (This laser 100 is similar to that discussed above with reference to FIG. 9E.) For fabrication purposes noted above, the total cavity length of the modified DFB+R laser 100 is preferably at least 150 μm or longer. As shown here, the DFB section 112 has a length of 80 μm, and the waveguide 110 has a length of 30 μm. The phase of the light at the front facet 123 is controlled by a grating 118 written in the front passive waveguide 116. The typical reflectivity of the grating 118 can be about 3%.

The etched rear facet 121' is etched backed or recessed amount of 20 μm, and the etched rear facet 121' can be defined at a slight angle. Instead of an HR coating, the etched rear facet 121' has an anti-reflection coating AR, and a high reflection grating mirror 113 (~90%) of a length of about 20 μm is provided in the MQW gain layer 112. A deep grating process performed on the backside grating HR mirror 113 can make this a preferred structure.

Although not shown, an additional configuration of the modified DFB+R laser 100 with an etched rear facet 121' having a high-reflective HR coating can be provided with an arrangement similar to that discussed above with reference to FIG. 9A. Likewise, an additional configuration of the modified DFB+R laser 100 with an etched rear facet 121' can be provided with an arrangement similar to that discussed above with reference to FIG. 9F.

The foregoing description of preferred and other embodiments is not intended to limit or restrict the scope or applicability of the inventive concepts conceived of by the Applicants. It will be appreciated with the benefit of the present disclosure that features described above in accordance with any embodiment or aspect of the disclosed subject matter can be utilized, either alone or in combination, with any other described feature, in any other embodiment or aspect of the disclosed subject matter.

In exchange for disclosing the inventive concepts contained herein, the Applicants desire all patent rights afforded by the appended claims. Therefore, it is intended that the appended claims include all modifications and alterations to the full extent that they come within the scope of the following claims or the equivalents thereof.

What is claimed is:

1. A distributed feedback plus reflection (DFB+R) laser, comprising:
   a distributed feedback (DFB) section having a first length between 60 to 150 microns and having a high reflection (HR) element; and
   a passive section coupled to the DFB section, the passive section having a second length between 30 to 80 microns and having a low reflection (LR) element opposite the DFB section, wherein the LR element occupies a subset of the second length with a portion of the passive section being between the LR element and the DFB section;
   wherein the DFB+R laser is directly modulated and is configured to operate uncooled;
   wherein a portion of the DFB section, the passive section, and the LR element form an etalon having a reflection profile with periodic peaks and valleys, and
   wherein the DFB section is configured to operate in a lasing mode aligned to a long-wavelength edge of one of the periodic peaks of the reflection profile of the etalon and the lasing mode has only a single mode hop throughout a bias range of the passive section.

2. The DFB+R laser of claim 1, wherein the LR element comprises:
   an LR mirror having a reflectivity of 15% or less;
   an LR mirror formed at a front of the passive section; or
   an LR coating formed on an output facet of the DFB+R laser.

3. The DFB+R laser of claim 1, wherein the LR element comprises an LR distributed Bragg reflector (DBR) formed in the passive section.

4. The DFB+R laser of claim 3, wherein a length of the LR DBR is 12 microns; and wherein a kappa of the LR DBR is at least 180 centimeter$^{-1}$.

5. The DFB+R laser of claim 4, wherein the DFB+R laser further comprises an anti-reflection coating formed on the output facet of the passive section.

6. The DFB+R laser of claim 1, wherein the HR element comprises:
   an HR mirror having a reflectivity of 30% or more;
   an HR mirror coupled to or formed at a rear of the DFB section; or
   an HR distributed Bragg reflector (DBR) mirror.

7. The DFB+R laser of claim 6, wherein the HR element comprises the HR DBR mirror, wherein a length of the HR DBR mirror is 15 microns, and wherein a kappa of the HR DBR mirror is between 500 cm$^{-1}$ to 1500 cm$^{-1}$.

8. The DFB+R laser of claim 6, wherein HR DBR mirror is formed in a multiple quantum well (MQW) layer of the DFB section.

9. The DFB+R laser of claim 1, further comprising a modulation contact coupled to the DFB section and configured to provide a modulation signal to the DFB section to modulate the DFB section, wherein modulation of the DFB section is configured to modulate cavity loss of the DFB+R laser and is configured to increase the carrier-photon resonance frequency (Fr) of the DFB+R laser.

10. The DFB+R laser of claim 9, wherein the carrier-photon resonance frequency (Fr) is at least 40 GHz.

11. The DFB+R laser of claim 1, further comprising a bias contact coupled to the passive section and configured to provide a bias signal to the passive section.

12. The DFB+R laser of claim 1, wherein the DFB section comprises an active section having a distributed feedback (DFB) grating; and wherein:
   the passive section comprises a passive waveguide coupled end-to-end with the active section; or
   the passive section comprises a pullback portion of the active section configured to be unpumped.

13. The DFB+R laser of claim 1, wherein a total cavity length of the DFB+R laser is at least 150 microns; and wherein a front end of the DFB+R laser has a recess etched therein, the recess having a front facet offset from the front end, the front facet having an anti-reflective coating.

14. The DFB+R laser of claim 13, wherein the DFB section comprises an active section having a distributed feedback (DFB) grating; and wherein:
   the passive section comprises a passive waveguide coupled end-to-end with the active section;
   the passive section comprises a passive waveguide coupled end-to-end with the active section and having a grating; or
   the passive section comprises a pullback portion of the active section configured to be unpumped, the pullback portion having a DBR mirror.

15. The DFB+R laser of claim 1, wherein a total cavity length of the DFB+R laser is at least 150 microns; and wherein a rear end of the DFB+R laser has a recess etched therein, the recess having a rear facet offset from the rear end.

16. The DFB+R laser of claim 15, wherein the DFB section comprises an active section having a distributed feedback (DFB) grating; and wherein the HR element of the DFB section comprises:
   an HR coating formed on the rear facet;
   an HR mirror coupled to or formed at the rear of the DFB section; or
   an HR distributed Bragg reflector (DBR) mirror.

17. The DFB+R laser of claim 1, wherein the bias range is from a threshold current to 100 mA.

18. A method comprising:

directly modulating a distributed feedback plus reflection (DFB+R) laser in uncooled operation;

generating laser light in a distributed feedback (DFB) section of the DFB+R laser having a first length between 60 to 150 microns and having a high reflection (HR) element;

coupling the laser light from the DFB section to a passive section having a second length between 30 to 80 microns and having a low reflection (LR) element, wherein the LR element occupies a subset of the second length with a portion of the passive section being between the LR element and the DFB section;

resonating the laser light in an etalon formed by a portion of the DFB section, the passive section, and the LR element, the etalon having a reflection profile with periodic peaks and valleys; and operating the DFB section in a lasing mode aligned to a long-wavelength edge of one of the periodic peaks of the reflection profile of the etalon and such that the lasing mode has only a single mode hop throughout a bias range of the passive section.

19. The method of claim 18, wherein resonating the laser light in the etalon comprises:

reflecting the laser light with an LR mirror for the LR element having a reflectivity of 15% or less;

reflecting the laser light with an LR mirror for the LR element formed at a front of the passive section;

reflecting the laser light with an LR coating for the LR element formed on an output facet of the DFB+R laser; or reflecting the laser light with an LR distributed Bragg reflector (DBR) for the LR element formed in the passive section.

20. The method of claim 18, wherein reflecting the laser light with the HR element comprises:

reflecting the laser light with an HR mirror for the HR element having a reflectivity of 30% or more;

reflecting the laser light with an HR mirror for the HR element coupled to or formed at a rear of the DFB section; or reflecting the laser light with an HR distributed Bragg reflector (DBR) mirror for the HR element.

21. The method of claim 18, wherein directly modulating the DFB+R laser in the uncooled operation comprises modulating the DFB section with a modulation signal configured to modulate cavity loss of the laser and configured to increase carrier-photon resonance frequency (Fr) of the laser.

22. The method of claim 21, comprising increasing the carrier-photon resonance frequency (Fr) to at least 40 GHz.

23. The method of claim 18, wherein generating the laser light in the distributed feedback (DFB) section of the DFB+R laser comprises operating an active section having a distributed feedback (DFB) grating.

24. The method of claim 18, further comprising providing a bias signal to the passive section with a bias contact coupled to the passive section.

* * * * *